United States Patent
Quitzk

(10) Patent No.: US 10,742,196 B2
(45) Date of Patent: Aug. 11, 2020

(54) APPARATUS AND METHOD FOR PERFORMING DIGITAL INFINITE IMPULSE FILTERING

(71) Applicant: NXP B.V., Eindhoven (NL)

(72) Inventor: Stefan Quitzk, Freital (DE)

(73) Assignee: NXP B.V., Eindhoven (NL)

( * ) Notice: Subject to any disclaimer, the term of this patent is extended or adjusted under 35 U.S.C. 154(b) by 36 days.

(21) Appl. No.: 16/207,061

(22) Filed: Nov. 30, 2018

(65) Prior Publication Data
US 2020/0177166 A1 Jun. 4, 2020

(51) Int. Cl.
*H03H 17/04* (2006.01)
*H03H 17/02* (2006.01)
*G06F 7/523* (2006.01)

(52) U.S. Cl.
CPC ............ *H03H 17/04* (2013.01); *G06F 7/523* (2013.01); *H03H 17/0225* (2013.01); *H03H 17/0283* (2013.01); *H03H 2017/0477* (2013.01)

(58) Field of Classification Search
CPC ............... H03H 17/04; H03H 17/0283; H03H 17/0225; G06F 7/523
USPC ................................................ 708/320, 316
See application file for complete search history.

(56) References Cited

U.S. PATENT DOCUMENTS

| | | | |
|---|---|---|---|
| 4,803,647 A * | 2/1989 | Dieterich | H03H 17/0288 708/320 |
| 6,360,240 B1 * | 3/2002 | Takano | H03H 17/02 708/316 |
| 6,845,135 B2 | 1/2005 | Du | |
| 2004/0151241 A1 * | 8/2004 | Shimotoyodome | H03H 17/0294 375/233 |
| 2005/0169360 A1 * | 8/2005 | Shimotoyodome | H03H 17/0294 375/232 |
| 2014/0059101 A1 | 2/2014 | Steele | |
| 2016/0112033 A1 | 4/2016 | Bhardwaj et al. | |

* cited by examiner

*Primary Examiner* — Tan V Mai
(74) *Attorney, Agent, or Firm* — Rajeev Madnawat

(57) ABSTRACT

Embodiments of An apparatus and method are disclosed. In an embodiment, an apparatus for performing digital infinite impulse response filtering includes a biquad core that includes five multiplier elements, each multiplier element including, a multiplier, a first delay element in series with and after the multiplier, and a second delay element in series with and after the first delay element, and a multiplexer associated with each of the five multiplier elements, each multiplexer configured to provide one of at least two different coefficients to the multiplier of the corresponding multiplier element.

20 Claims, 7 Drawing Sheets

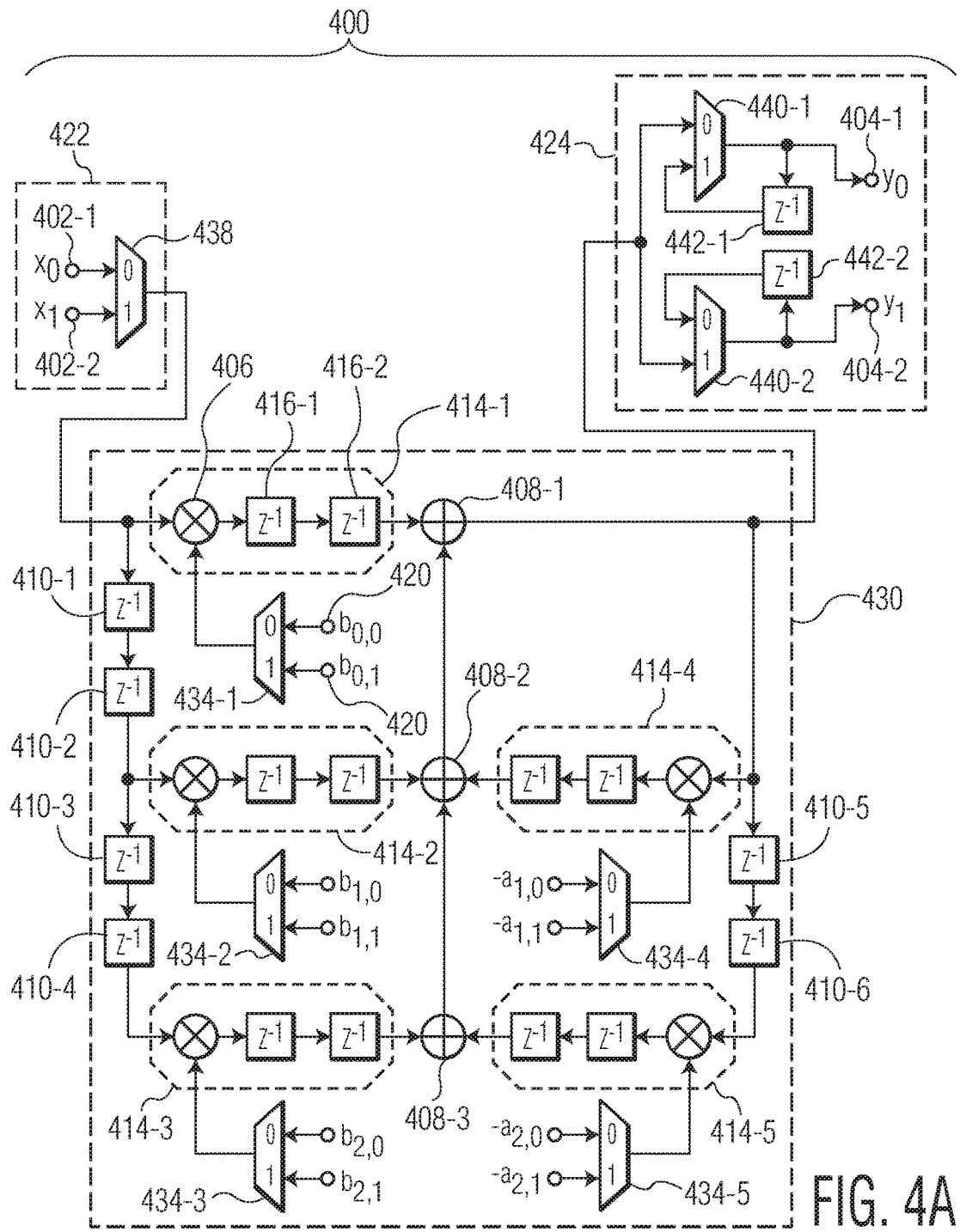
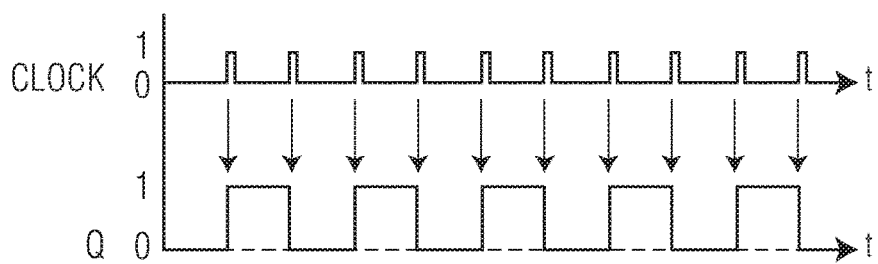
FIG. 4A
FIG. 4B

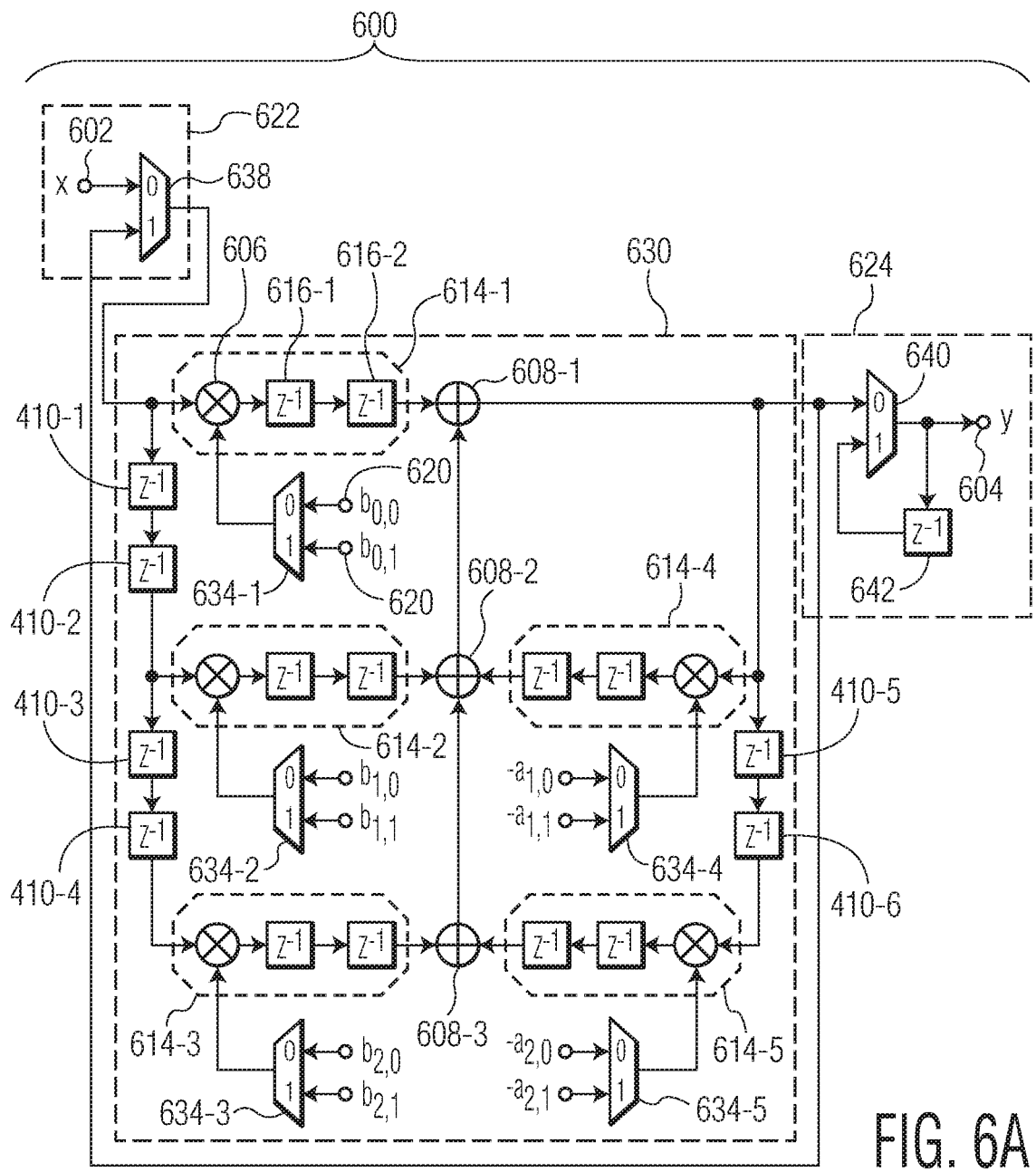
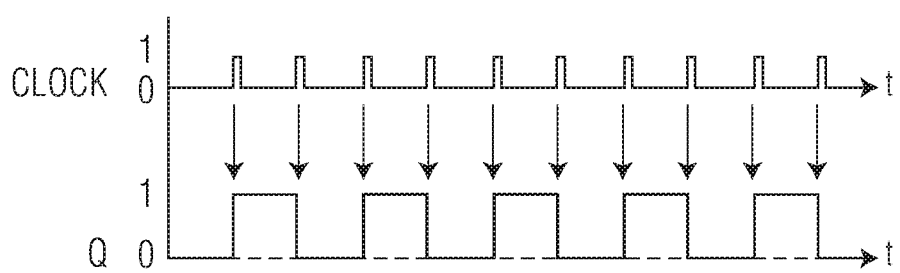
FIG. 6A
FIG. 6B

APPARATUS AND METHOD FOR PERFORMING DIGITAL INFINITE IMPULSE FILTERING

BACKGROUND

Biquad filters are often used for processing of digital audio signals. Biquad filters used to implement Infinite Impulse Response (IIR) filtering typically include a feedback element and thus the processing speed of a biquad filter is limited by the timing of the most critical feedback path. Typically, the timing of the most critical feedback path is set by the delay of the first multiplier. If the applied multipliers have a latency of more than one clock cycle, some of the multipliers may not be efficiently used.

SUMMARY

Embodiments of An apparatus and method are disclosed. In an embodiment, an apparatus for performing digital infinite impulse response filtering includes a biquad core that includes five multiplier elements, each multiplier element including, a multiplier, a first delay element in series with and after the multiplier, and a second delay element in series with and after the first delay element, and a multiplexer associated with each of the five multiplier elements, each multiplexer configured to provide one of at least two different coefficients to the multiplier of the corresponding multiplier element.

In an embodiment of the apparatus, the biquad core further includes a pair of delay elements in series between two of the multiplier elements.

In an embodiment of the apparatus, the biquad core further includes a first pair of delay elements in series between a first multiplier element and a second multiplier element of the five multiplier elements, a second pair of delay elements in series between the second multiplier element and a third multiplier element of the five multiplier elements, and a third pair of delay elements in series between a fourth multiplier element and a fifth multiplier element of the five multiplier elements.

In an embodiment of the apparatus, the delay elements are configured to impart a delay of one clock cycle of a system clock.

In an embodiment, the apparatus further includes an input module that includes two inputs to receive two different input signals and a multiplexer configured to select one of the two input signals for insertion into the biquad core. In an embodiment of the apparatus, the multiplexer is alternated between two states at each clock cycle of a system clock.

In an embodiment, the apparatus further includes an output module that includes a first multiplexer that receives an intermediate output signal from the biquad core and a delayed version of the intermediate output signal and that is configured to select either the intermediate output signal or the delayed version of the intermediate output signal for outputting from a first output, and a second multiplexer that receives the intermediate output signal from the biquad core and a delayed version of the intermediate output signal and that is configured to select either the intermediate output signal or the delayed version of the intermediate output signal for outputting from a second output. In an embodiment of the apparatus, the multiplexers are alternated between two states at each clock cycle of a system clock.

In an embodiment, the apparatus further includes an input module that includes an input to receive an input signal and a multiplexer configured to select either the input signal or a feedback signal for insertion into the biquad core. In an embodiment of the apparatus, the multiplexer is alternated between two states at each clock cycle of a system clock.

In an embodiment, the apparatus further includes an output module that includes a multiplexer that receives an intermediate output signal from the biquad core and a delayed version of the intermediate output signal and that is configured to select either the intermediate output signal or the delayed version of the intermediate output signal for outputting from an output. In an embodiment of the apparatus, the multiplexers are alternated between two states at each clock cycle of a system clock.

In an embodiment of the apparatus, the multiplexers are alternated between two states at each clock cycle of a system clock.

An embodiment of a method for performing digital infinite impulse response filtering is disclosed. The method involves performing multiplication operations in a biquad filter, applying two delay elements in series to the results of the multiplication operations, and switching between two different coefficients on successive multiplication operations.

In an embodiment of the method, the switching between two different coefficients occurs on each clock cycle of a system clock.

In an embodiment, the method further involves providing two different input signals for the multiplication operations in an alternating fashion.

In an embodiment of the method, the switching between two different coefficients occurs on each clock cycle of a system clock and further comprising providing two different input signals for the multiplication operations in an alternating fashion at each clock cycle.

In an embodiment, the method further involves providing either an input signal or a feedback signal for the multiplication operations in an alternating fashion.

In an embodiment of the method, the switching between two different coefficients occurs on each clock cycle of a system clock and further comprising providing either an input signal or a feedback signal for the multiplication operations in an alternating fashion at each clock cycle.

Another embodiment of a method for performing digital infinite impulse response filtering is disclosed. The method involves performing first multiplication operations using first coefficients that are provided to multipliers of a biquad core to generate results, switching the coefficients that are provided to the multipliers of the biquad core to second coefficients, performing second multiplication operations using the second coefficients that are provided to the multipliers of the biquad core to generate results, applying a first delay to the results of the first multiplication operations via first delay elements to generate once-delayed results, applying a second delay to the once-delayed results via second delay elements to generate twice-delayed results, applying the first delay to the results of the second multiplication operations via the first delay element to generate once-delayed results, and applying the second delay to the once-delayed results via the second delay elements to generate twice-delayed results, wherein the switching between coefficients occurs on each clock cycle of a system clock and wherein the first and second delay elements are configured to impart a delay of one clock cycle of the system clock.

Other aspects in accordance with the invention will become apparent from the following detailed description, taken in conjunction with the accompanying drawings, illustrated by way of example of the principles of the invention.

BRIEF DESCRIPTION OF THE DRAWINGS

FIG. 4A depicts a biquad filter in accordance with an embodiment of the invention that includes a biquad core that employs multiplier elements that implement the slow multiplier model as depicted in FIG. 2C and multiplexers configured to provide signal-specific coefficients to the multipliers.

FIG. 4B is a signal timing diagram of the state of a multiplexer input signal, Q, relative to a system clock, Clock.

FIG. 6A depicts a biquad filter in accordance with an embodiment of the invention that includes a biquad core that employs multiplier elements that implement the slow multiplier model as depicted above in FIG. 2C and multiplexers configured to provide signal-specific coefficients to the multipliers.

FIG. 6B is a signal timing diagram of the state of a multiplexer input signal, Q, relative to a system clock, Clock.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
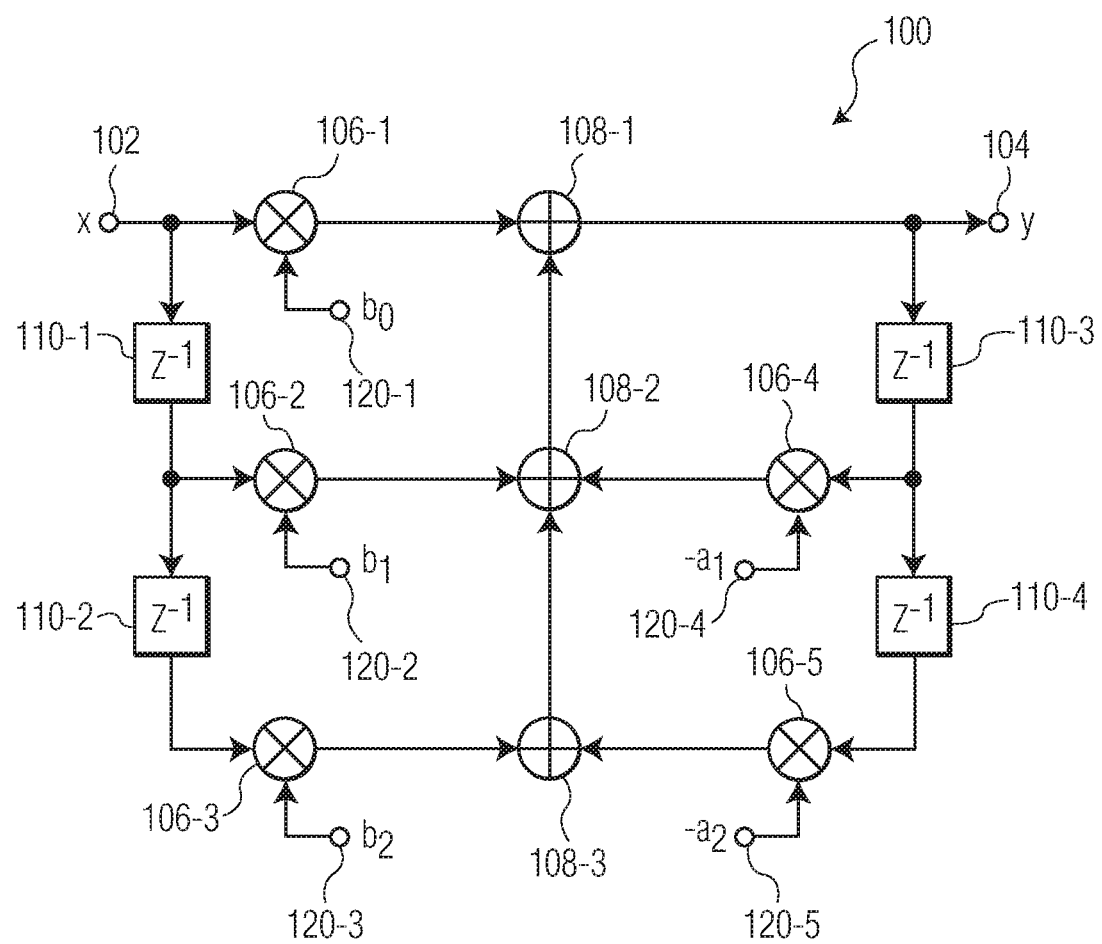
FIG. 1 depicts a direct form 1 flow graph of a biquad filter as is known in the field.

FIG. 1 depicts a flow graph of a biquad filter 100 as is known in the field. In the example of FIG. 1, the flow graph is in "direct form 1," as is known in the field, although the biquad filter could also be represented in "direct form 2," as is known in the field. As depicted in FIG. 1, the biquad includes an input 102 for receiving an input signal, x, and an output 104 for outputting an output signal, y, five multipliers 106-1-106-5, three adders 108-1-108-3, and four delay elements 110-1-110-4. As is known in the field, the multipliers represent multiplication operations and the adders represent addition operations and the underlining hardware, software, and/or firmware used to implement these operations are known in the field. The multipliers perform the multiplication operations according to a corresponding coefficient, e.g., $b_0$, $b_1$, $b_2$, $-a_1$, and $-a_2$, which are provided via coefficient inputs 120-1-120-5. The coefficients are typically a constant value.

Figure 2A:
FIG. 2A depicts an ideal multiplier model, represented by a multiplier.
Figure 2B:
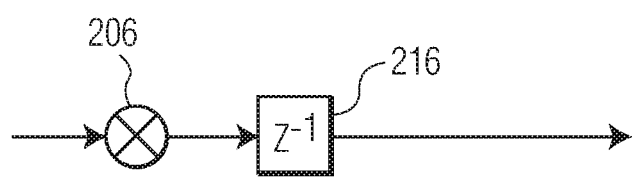
FIG. 2B depicts a fast multiplier model, represented by a multiplier in series with a delay element, $z^{-1}$.
Figure 2C:
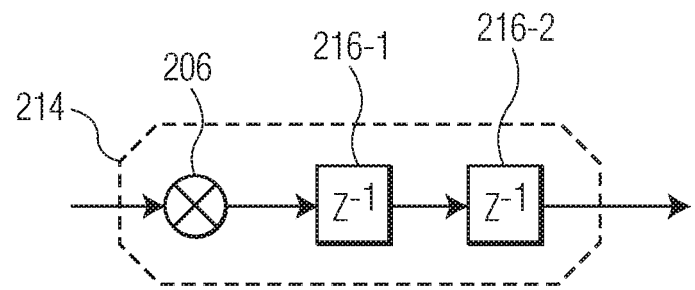
FIG. 2C depicts a slow multiplier model, represented by a multiplier in series with two delay elements, $z^{-1}$.

In FIG. 1, the multipliers 106-1-106-5 of the biquad filter 100 are assumed to be ideal in terms of processing time. However, using real digital hardware and depending on the accuracy and system clock frequency, the multipliers may have a delay. Three different types of multiplier models are depicted in FIGS. 2A-2C. FIG. 2A depicts an ideal multiplier model, represented by a multiplier 206. FIG. 2B depicts a fast multiplier model, represented by a multiplier 206 and in series with a delay element, $z^{-1}$, 216. FIG. 2C depicts a slow multiplier model, represented by a multiplier element 214 that includes a multiplier 206 in series with two delay elements, $z^{-1}$, 216-1 and 216-2. In the examples of FIGS. 2B and 2C, the delay elements represent a delay of one clock cycle, based on, for example, the Z-transform.

Often digital multipliers are designed as a multi-stage pipeline, in which the final multiplier result takes several system clock cycles to produce. Multi-stage pipelines use a higher system clock frequency and can save silicon area. Whereas the runtime of calculations made by a single biquad filter, such as the biquad filter shown in FIG. 1, typically does not waste clock cycles, a multi-stage pipeline can be problematic when fast feedback is needed, for example, as is the case for digital IIR filters and especially for biquad filters. Thus, an increase in the number of stages in a pipeline may directly increase the runtime of calculations made by a biquad filter. For example, the first stage of a biquad filter may be left indirectly waiting for feedback to proceed. Thus, such pipelined multipliers may not be operating as efficiently as possible.

Figure 3:
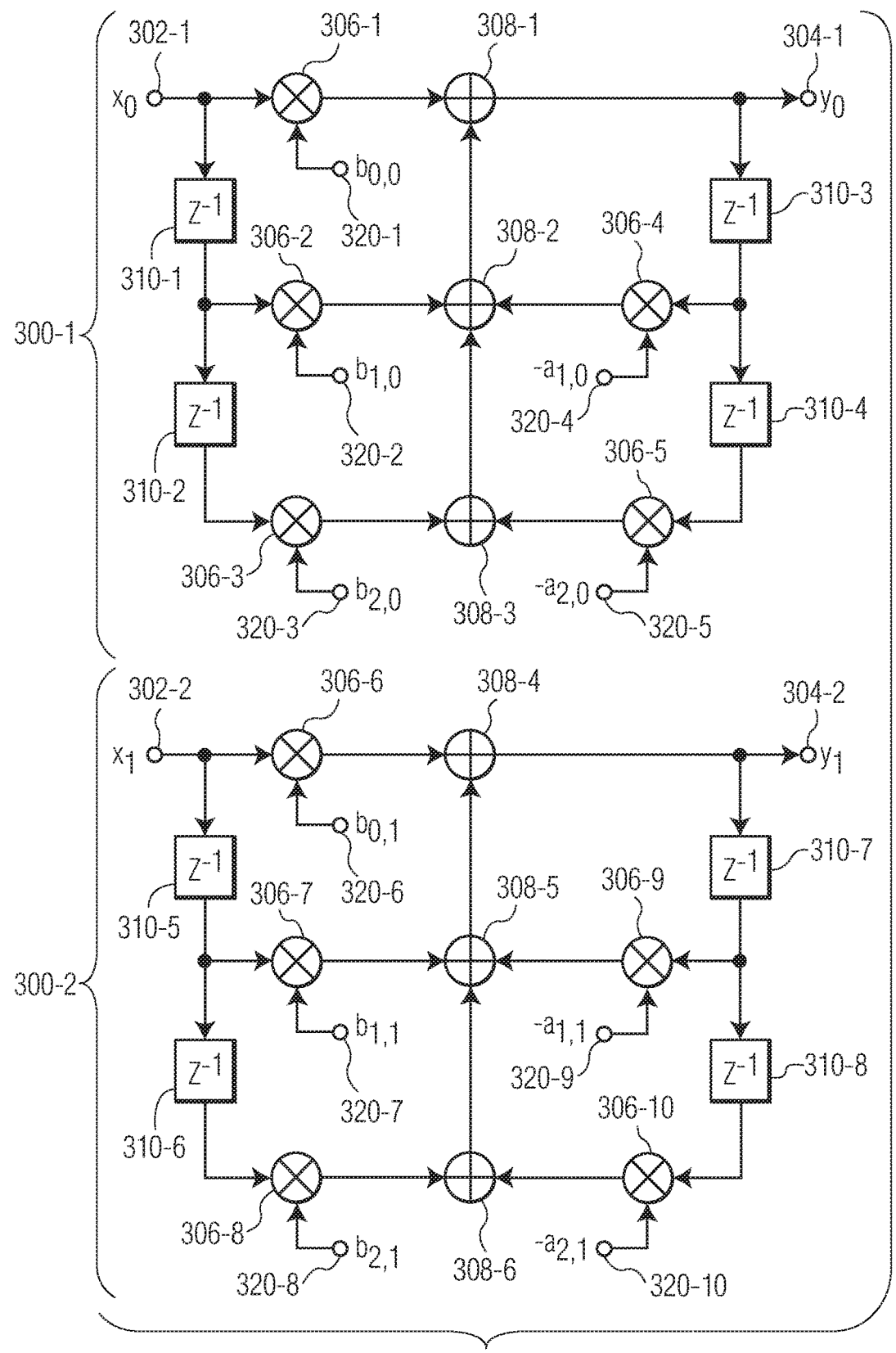
FIG. 3 depicts a conventional configuration of two biquad filters that are run in parallel to process a digital stereo audio signal that has two digital signal components, $x_0$ and $x_1$.

In some digital filtering applications, such as digital stereo audio signal processing, two biquad filters are typically run in parallel. FIG. 3 depicts a conventional configuration of two biquad filters 300-1 and 300-2 that are run in parallel to process a digital stereo audio signal that has two digital signal components, $x_0$ and $x_1$. As depicted in FIG. 3, each biquad filter includes an input 302-1 and 302-2 for receiving an input signal, $x_0$ and $x_1$, respectively, and a corresponding output 304-1 and 304-2 for outputting an output signal, $y_0$ and $y_1$, respectively, five multipliers 306-1-306-10, three adders 308-1-308-6, and four delay elements 310-1-310-8 similar to the biquad filter shown in FIG. 1. The multipliers of the biquad filter 300-1 perform the multiplication operations according to the corresponding coefficients, e.g., $b_{0,0}$, $b_{1,0}$, $b_{2,0}$, $-a_{1,0}$, and $-a_{2,0}$ and the multipliers of the biquad filter 300-2 perform the multiplication operations according to the corresponding coefficients, e.g., $b_{0,1}$, $b_{1,1}$, $b_{2,1}$, $-a_{1,1}$, and $-a_{2,1}$. The coefficients are typically a constant value. As illustrated in FIG. 3, the digital stereo audio signal is processed using two biquad filters in parallel. Each of the two biquad filters consumes resources, e.g., hardware, software, and/or firmware to implement.

In accordance with an embodiment of the invention, the multipliers of a biquad filter may be shared in a manner that enables a very efficient digital IIR filtering using a biquad filter. For example, in an embodiment, a system for performing digital IIR may include a biquad core that includes five multiplier elements, with each multiplier element including a multiplier, a first delay element in series with and after the multiplier, and a second delay element in series with and after the first delay element. The biquad core may also include a multiplexer associated with each of the five multiplier elements, with each multiplexer configured to provide one of at least two different coefficients to the multiplier of the corresponding multiplier element. Such a system for IIR filtering can process an input signal, such as a digital stereo audio signal, in a manner that efficiently utilizes biquad resources. The system may also include additional delay elements to synchronize the signal processing of the input signal. In operation, a method for performing digital IIR filtering involves performing multiplication operations in a biquad filter, applying two delay elements in series to the results of the multiplication operations, and switching between two different coefficients on successive multiplication operations. Additionally, the switching between two different coefficients may occur on each clock cycle of a system clock.

With reference to FIG. 4A and in contrast to the configuration of the two parallel biquad filters 301-1 and 301-2 as depicted in FIG. 3, a biquad filter 400 that shares resources to process a digital signal such as a digital stereo audio signal is disclosed. The biquad filter 400 includes an input module 422, an output module 424, and a biquad core 430. The biquad core employs multiplier elements that implement the slow multiplier model as depicted above in FIG. 2C and multiplexers configured to provide signal-specific coefficients to the multipliers. At a high level, the biquad filter is configured to switch between processing each of the two digital stereo audio signals, $x_0$ and $x_1$, at alternating clock periods.

With reference to FIG. 4A, the input module 422 includes a first input 402-1 for receiving an input signal, $x_0$, a second input 402-2 for receiving an input signal, $x_1$, and a multiplexer 438 for switching between the two input signals. The output module 424 includes two multiplexers 440-1 and 440-2 for receiving the output of the biquad core 430, two delay elements 442-1 and 442-2, a first output 404-1 for outputting the output signal, $y_0$, and a second output 404-2 for outputting the output signal, $y_1$.

The biquad core 430 includes five multiplier elements 414-1-414-5, five multiplexers 434-1-434-5, three adders 408-1-408-3, and six delay elements 410-1-410-6. Each of the multiplier elements includes a multiplier 406, a first delay element 416-1 in series with and after the multiplier, and a second delay element 416-2 in series with and after the first delay element (note that only one multiplier, one first delay element, and one second delay element are labeled with a reference number so as to keep the drawing free of unnecessary clutter). For example, the first delay element is in series with and after the multiplier in that a multiplication operation is performed in a processing sequence before a first delay operation occurs (e.g., before in a time sequence) and the second delay element is in series with and after the first delay element in that the first delay operation occurs in a processing sequence before a second delay operation (e.g., before in a time sequence). Each multiplier of the biquad core performs the multiplication operation according to a corresponding coefficient that is provided by a coefficient input 420 and selected by the multiplexer that corresponds to the multiplier (note that only one coefficient input is labeled with a reference number so as to keep the drawing free of unnecessary clutter). For example, coefficient $b_{0,0}$ or $b_{0,1}$ is selected by multiplexer 434-1, coefficient $b_{1,0}$ or $b_{1,1}$ is selected by multiplexer 434-2, coefficient $b_{2,0}$ or $b_{2,1}$ is selected by multiplexer 434-3, coefficient $-a_{1,0}$ or $-a_{1,1}$ is selected by multiplexer 434-4, and coefficient $-a_{2,0}$ or $-a_{2,1}$ is selected by multiplexer 434-5. The coefficients are typically a constant value. The biquad core 430 includes an additional delay element between the multiplier elements, as compared to the biquad filters shown in FIGS. 1 and 3, to synchronize the timing of processing the two input signals. For example, the biquad filter 400 of FIG. 4A includes two delay elements in series (e.g., delay elements 410-1/410-2, delay elements 410-3/410-4, and delay elements 410-5/410-6) to synchronize the timing of processing the two input signals.

In operation of the biquad filter 400 of FIG. 4A, at each clock cycle of a system clock, the multiplexer 438 of the input module 422 is alternated between "0 and "1" in sync with a system clock such that one of the signals ($x_0$ or $x_1$) is inserted into the biquad core 430 for processing. Signals proceed through the biquad core as illustrated by the processing arrows and the multiplexers 434-1-434-5 associated with the multipliers are alternated between "0" and "1" in sync with the system clock so that the corresponding coefficients are selected and used in the multiplication processes. For example, the coefficients $b_{0,0}$, $b_{1,0}$, $b_{2,0}$, $-a_{1,0}$, and $-a_{2,0}$ are selected and used in the multiplication processes associated with input signal $x_0$ and coefficients $b_{0,1}$, $b_{1,1}$, $b_{2,1}$, $-a_{1,1}$, and $-a_{2,1}$ are selected and used in the multiplication processes associated with input signal $x_1$. FIG. 4B is a signal timing diagram of the state of a multiplexer input signal, Q, relative to a system clock, Clock. As illustrated in FIG. 4B, the state of the multiplexer, Q, alternates between "0" and "1" with each pulse/cycle of the system clock.

The biquad filter 400 depicted in FIG. 4A can process a two input signals (e.g., two components of a digital stereo audio signal) with the same number of multipliers and adders as the biquad filter 100 depicted in FIG. 1 without in a manner that does not waste clock cycles but that does not require a doubling of resources as is the case for the parallel biquad filters 300-1 and 300-2 depicted in FIG. 3.

Figure 5:
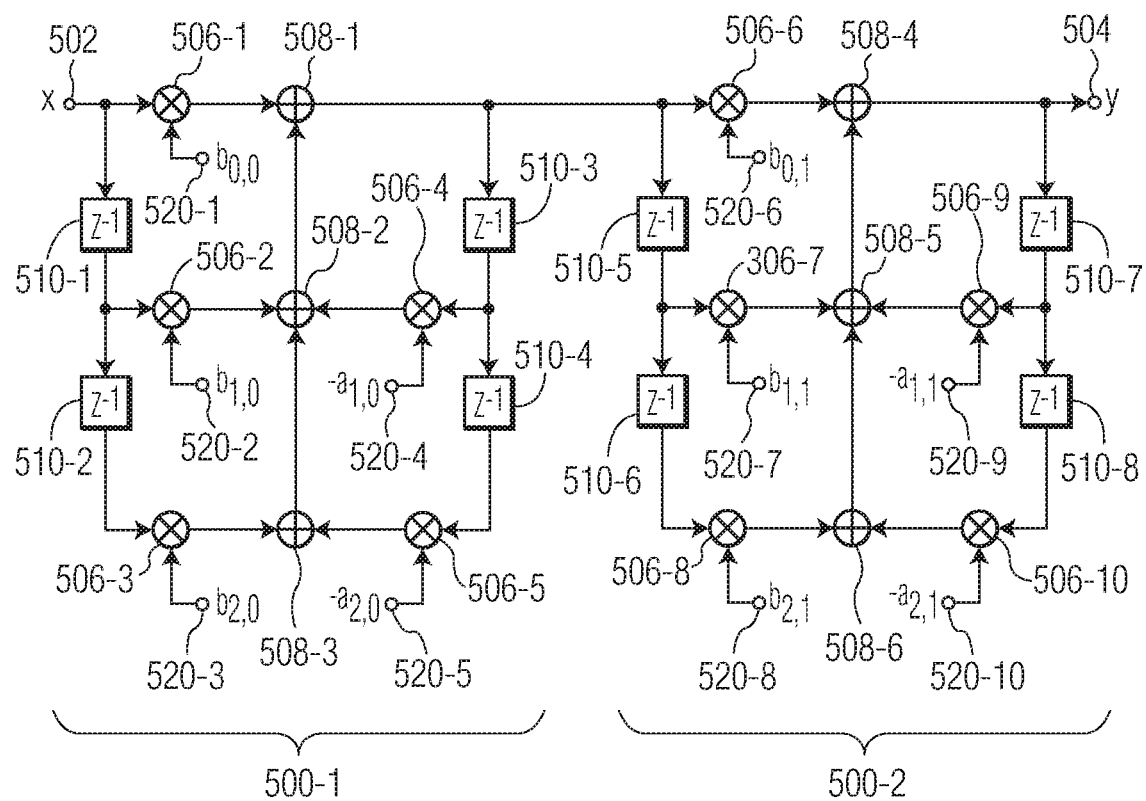
FIG. 5 depicts a conventional configuration of two biquad filters cascaded with each other to process a digital signal such as a digital audio signal.

In some digital filtering applications, such as digital audio signal processing, two biquad filters are cascaded. FIG. 5 depicts a conventional configuration of two biquad filters 500-1 and 500-2 cascaded with each other to process a digital signal such as a digital audio signal. The digital audio signal may have two digital signal components, $x_0$ and $x_1$ (not shown), but the digital signal is input to the biquad filter at a single input as a single digital signal, x. As depicted in FIG. 5, the cascaded biquad filters include an input 502 for receiving an input signal, x, and an output 504 for outputting an output signal, y. Each biquad filter includes five multipliers 506-1-506-10, three adders 508-1-508-6, and four delay elements 510-1-510-8 similar to the biquad filter shown in FIG. 1. The multipliers of the first biquad filter 500-1 in the cascaded configuration perform the multiplication operations according to the corresponding coefficients, e.g., $b_{0,0}$, $b_{1,0}$, $b_{2,0}$, $-a_{1,0}$, and $-a_{2,0}$ and the multipliers of the second biquad filter 500-2 in the cascaded configuration perform the multiplication operations according to the corresponding coefficients, e.g., $b_{0,1}$, $b_{1,1}$, $b_{2,1}$, $-a_{1,1}$, and $-a_{2,1}$. The coefficients are provided to the multipliers via coefficient inputs 520-1-520-10 typically are a constant value. As illustrated in FIG. 5, the digital audio signal is processed using two cascaded biquad filters and each of the two biquad filters consumes resources, e.g., hardware, software, and/or firmware, to implement.

In contrast to the configuration of the two cascaded biquad filters depicted in FIG. 5, a biquad filter that shares resources to process a digital signal, such as an audio signal, is disclosed. FIG. 6A depicts an embodiment of a biquad filter 600 that includes an input module 622, an output module 624, and a biquad core 630. Similar to the biquad core depicted in FIG. 4A, the biquad core depicted in FIG. 6A employs multiplier elements that implement the slow multiplier model as depicted above in FIG. 2C and multiplexers configured to provide signal-specific coefficients to the multipliers. At a high level, the biquad filter is configured to switch between processing components of the digital signal, e.g., an audio signal that includes two components, $x_0$ and $x_1$, at alternating clock periods.

With reference to FIG. 6A, the input module includes an input 602 for receiving an input signal, x, and a multiplexer 638 that receives an intermediate output signal (also referred to as a feedback signal) from the biquad core. The multiplexer of the input module is configured to switch between selecting the input signal, x, and the intermediate output signal. The output module 624 includes a multiplexer 640 that receives the intermediate output signal from the biquad core 630 and a delayed intermediate output signal from a delay element 642 and outputs an output signal, y, to an output 604. The multiplexer of the output module is configured to switch between selecting the intermediate output signal and the delayed intermediate output signal.

The biquad core 630 includes five multiplier elements 614-1-614-5, five multiplexers 634-1-634-5, three adders 608-1-608-3, and six delay elements 610-1-610-6. Each of the multiplier elements includes a multiplier 606, a first delay element 616-1 in series with and after the multiplier, and a second delay element 616-2 in series with and after the first delay element (note that only one multiplier, one first delay element, and one second delay element are labeled with a reference number so as to keep the drawing free of unnecessary clutter). For example, the first delay element is in series with and after the multiplier in that a multiplication operation is performed in a processing sequence before a first delay operation occurs (e.g., before in a time sequence) and the second delay element is in series with and after the first delay element in that the first delay operation occurs in a processing sequence before a second delay operation (e.g., before in a time sequence). Each multiplier 606 of the biquad core 630 performs the multiplication operation according to a corresponding coefficient that is provided via a coefficient input 620 and selected by the multiplexer that corresponds to the multiplier (note that only one coefficient input is labeled with a reference number so as to keep the drawing free of unnecessary clutter). For example, coefficient $b_{0,0}$ or $b_{0,1}$ is selected by multiplexer 634-1, coefficient $b_{1,0}$ or $b_{1,1}$ is selected by multiplexer 634-2, coefficient $b_{2,0}$ or $b_{2,1}$ is selected by multiplexer 634-3, coefficient $-a_{1,0}$ or $-a_{1,1}$ is selected by multiplexer 634-4, and coefficient $-a_{2,0}$ or $-a_{2,1}$ is selected by multiplexer 634-5. The coefficients are typically a constant value. The biquad core 630 includes an additional delay element between the multiplier elements, as compared to the biquad filters shown in FIGS. 1 and 5, to synchronize the timing of processing the two input signals. For example, the biquad filter 600 of FIG. 6A includes two delay elements in series (e.g., delay elements 610-1/610-2, delay elements 610-3/610-4, and delay elements 610-5/610-6) to synchronize the timing of processing the two input signals.

In operation of the biquad filter 600 of FIG. 6A, at each clock cycle of a system clock, the multiplexer 638 of the input module 622 is alternated between "0" and "1" in sync with the system clock such that one of the signals (input signal x or the feedback signal) is inserted into the biquad core 630 for processing. Signals proceed through the biquad core as illustrated by the processing arrows and the multiplexers 634-1-634-5 associated with the multipliers 606 are alternated between "0" and "1" in sync with the system clock so that the corresponding coefficients are selected and used in the multiplication processes. For example, the coefficients $b_{0,0}$, $b_{1,0}$, $b_{2,0}$, $-a_{1,0}$, and $-a_{2,0}$ are selected and used in the multiplication processes associated with one component of the input signal x (e.g., an $x_0$ component of a stereo signal) and coefficients $b_{0,1}$, $b_{1,1}$, $b_{2,1}$, $-a_{1,1}$, and $-a_{2,1}$ are selected and used in the multiplication processes associated with another component of the input signal x. FIG. 6B is a signal timing diagram of the state of a multiplexer input signal, Q, relative to a system clock, Clock. As illustrated in FIG. 6B, the state of the multiplexer, Q, alternates between "0" and "1" with each pulse/cycle of the system clock.

The biquad filter 600 depicted in FIG. 6A can process a complex input signals (e.g., an input signal with two components of a digital audio signal) with the same number of multipliers and adders as the biquad filter 100 depicted in FIG. 1 in a manner that does not waste clock cycles but that does not require a doubling of resources as is the case for the cascaded biquad filters 500-1 and 500-2 depicted in FIG. 5.

In an embodiment, the biquad filters described above with reference to FIGS. 4A, 4B, 6A, and 6B are implemented in circuits on an integrated circuit (IC) device. In another embodiment, the biquad filters described above with reference to FIGS. 4A, 4B, 6A, and 6B are implemented in a digital processor device. The embodiments of the biquad filters described above with reference to FIGS. 4A, 4B, 6A, and 6B can efficiently use all five multipliers. Thus, fewer multipliers may need to be fabricated on a silicon substrate, thereby saving valuate real estate on a silicon substrate. In an embodiment, in which the biquad filters described above with reference to FIGS. 4A, 4B, 6A, and 6B are implemented in a digital processor containing a limited number of multipliers, the load on the processor can be reduced.

Although biquad cores with five multiplier elements are described herein, embodiments in which the biquad cores include more than five multiplier elements are possible.

Figure 7:
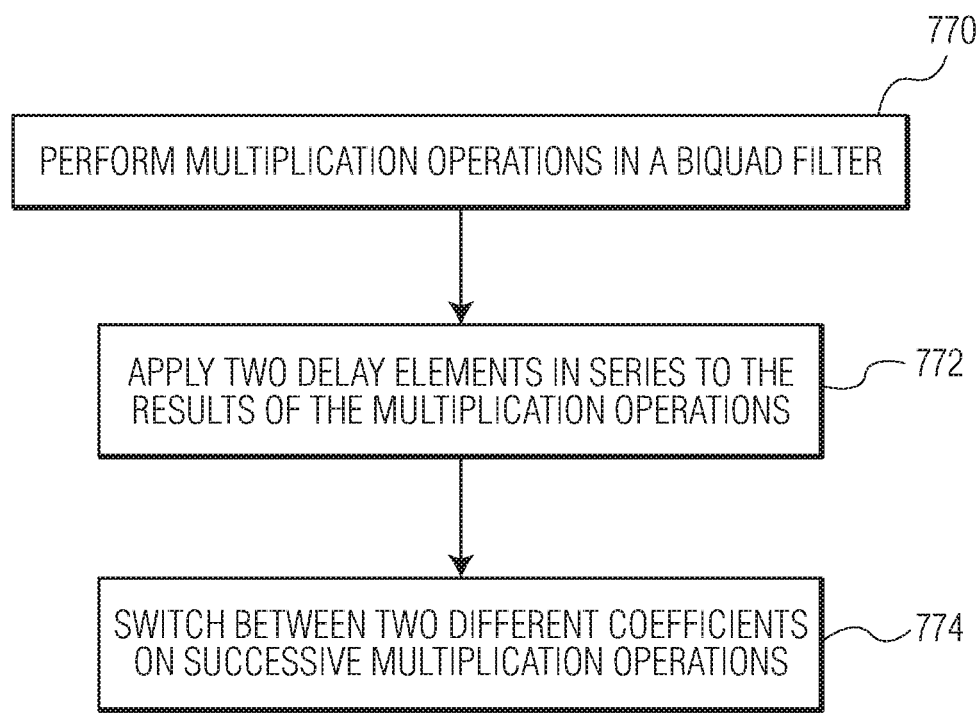
FIG. 7 is a process flow diagram of a method for performing digital IIR filtering.

FIG. 7 is a process flow diagram of a method for performing digital IIR filtering. According to method, at block 770 multiplication operations are performed in a biquad filter. At block 772, two delay elements are applied in series to the results of the multiplication operations. At block 774, switching between two different coefficients occurs on successive multiplication operations. In an embodiment, the switching between two different coefficients occurs on each clock cycle of a system clock. In an embodiment, two different input signals are provided for the multiplication operations in an alternating fashion.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An apparatus for performing digital infinite impulse response filtering, the apparatus comprising:
   a biquad core that includes:
   five multiplier elements connected to each other in a biquad core configuration, each multiplier element including:
   a multiplier;
   a first delay element in series with and after the multiplier;
   a second delay element in series with and after the first delay element;
   a multiplexer associated with each of the five multiplier elements, each multiplexer configured to provide one of at least two different coefficients to the multiplier of the corresponding multiplier element.

2. The apparatus of claim 1, wherein the biquad core further comprises a pair of delay elements in series between two of the multiplier elements.

3. The apparatus of claim 1, wherein the biquad core further comprises a first pair of delay elements in series between a first multiplier element and a second multiplier element of the five multiplier elements, a second pair of delay elements in series between the second multiplier element and a third multiplier element of the five multiplier elements, and a third pair of delay elements in series between a fourth multiplier element and a fifth multiplier element of the five multiplier elements.

4. The apparatus of claim 1 wherein the delay elements are configured to impart a delay of one clock cycle of a system clock.

5. The apparatus of claim 1, further comprising an input module that includes two inputs to receive two different input signals and a multiplexer configured to select one of the two input signals for insertion into the biquad core.

6. The apparatus of claim 5, wherein the multiplexer is alternated between two states at each clock cycle of a system clock.

7. The apparatus of claim 5, further comprising an output module that includes:
   a first multiplexer that receives an intermediate output signal from the biquad core and a delayed version of the intermediate output signal and that is configured to select either the intermediate output signal or the delayed version of the intermediate output signal for outputting from a first output; and
   a second multiplexer that receives the intermediate output signal from the biquad core and a delayed version of the intermediate output signal and that is configured to select either the intermediate output signal or the delayed version of the intermediate output signal for outputting from a second output.

8. The apparatus of claim 7, wherein the multiplexers are alternated between two states at each clock cycle of a system clock.

9. The apparatus of claim 1, further comprising an input module that includes an input to receive an input signal and a multiplexer configured to select either the input signal or a feedback signal for insertion into the biquad core.

10. The apparatus of claim 9, wherein the multiplexer is alternated between two states at each clock cycle of a system clock.

11. The apparatus of claim 9, further comprising an output module that includes a multiplexer that receives an intermediate output signal from the biquad core and a delayed version of the intermediate output signal and that is configured to select either the intermediate output signal or the delayed version of the intermediate output signal for outputting from an output.

12. The apparatus of claim 11, wherein the multiplexers are alternated between two states at each clock cycle of a system clock.

13. The apparatus of claim 1, wherein the multiplexers are alternated between two states at each clock cycle of a system clock.

14. A method for performing digital infinite impulse response filtering, the method comprising:
   performing multiplication operations in a biquad filter;
   applying two delay elements in series to the results of the multiplication operations; and
   switching between two different coefficients on successive multiplication operations.

15. The method of claim 14, wherein the switching between two different coefficients occurs on each clock cycle of a system clock.

16. The method of claim 14, further comprising providing two different input signals for the multiplication operations in an alternating fashion.

17. The method of claim 14, wherein the switching between two different coefficients occurs on each clock cycle of a system clock and further comprising providing two different input signals for the multiplication operations in an alternating fashion at each clock cycle.

18. The method of claim 14, further comprising providing either an input signal or a feedback signal for the multiplication operations in an alternating fashion.

19. The method of claim 14, wherein the switching between two different coefficients occurs on each clock cycle of a system clock and further comprising providing either an input signal or a feedback signal for the multiplication operations in an alternating fashion at each clock cycle.

20. A method for performing digital infinite impulse response filtering, the method comprising:

performing first multiplication operations using first coefficients that are provided to multipliers of a biquad core to generate results;

switching the coefficients that are provided to the multipliers of the biquad core to second coefficients;

performing second multiplication operations using the second coefficients that are provided to the multipliers of the biquad core to generate results;

applying a first delay to the results of the first multiplication operations via first delay elements to generate once-delayed results;

applying a second delay to the once-delayed results via second delay elements to generate twice-delayed results;

applying the first delay to the results of the second multiplication operations via the first delay element to generate once-delayed results; and applying the second delay to the once-delayed results via the second delay elements to generate twice-delayed results;

wherein the switching between coefficients occurs on each clock cycle of a system clock and wherein the first and second delay elements are configured to impart a delay of one clock cycle of the system clock.

* * * * *